(12) United States Patent
Lew et al.

(10) Patent No.: US 9,502,090 B2
(45) Date of Patent: Nov. 22, 2016

(54) MEMORY DEVICE INCLUDING A DOMAIN WALL AND FERROMAGNETIC DRIVER NANOWIRE

(71) Applicant: Nanyang Technological University, Singapore (SG)

(72) Inventors: Wen Siang Lew, Singapore (SG); Indra Purnama, Singapore (SG); Chandra Sekhar Murapaka, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 14/759,073

(22) PCT Filed: Jan. 2, 2014

(86) PCT No.: PCT/SG2014/000002
§ 371 (c)(1),
(2) Date: Jul. 2, 2015

(87) PCT Pub. No.: WO2014/107140
PCT Pub. Date: Jul. 10, 2014

(65) Prior Publication Data
US 2015/0371696 A1 Dec. 24, 2015

Related U.S. Application Data

(60) Provisional application No. 61/748,316, filed on Jan. 2, 2013.

(51) Int. Cl.
| | | |
|---|---|---|
| G11C 11/00 | (2006.01) | |
| G11C 11/16 | (2006.01) | |
| G11C 11/14 | (2006.01) | |
| G11C 11/15 | (2006.01) | |
| G11C 19/08 | (2006.01) | |

(52) U.S. Cl.
CPC ............ *G11C 11/1673* (2013.01); *G11C 11/14* (2013.01); *G11C 11/15* (2013.01); *G11C 11/16* (2013.01); *G11C 11/161* (2013.01); *G11C 11/1675* (2013.01); *G11C 19/0808* (2013.01); *G11C 19/0833* (2013.01); *G11C 19/0841* (2013.01)

(58) Field of Classification Search
CPC ... G11C 11/16; G11C 11/14; G11C 19/0808; G11C 11/161; G11C 11/02; G11C 19/0833
USPC .................................. 365/158, 171, 173, 33
See application file for complete search history.

(56) References Cited

U.S. PATENT DOCUMENTS

| | | | | |
|---|---|---|---|---|
| 7,492,622 B2* | 2/2009 | Parkin | ..................... | G11C 11/14 365/80 |
| 7,710,769 B2* | 5/2010 | Cowburn | ........... | G11C 19/0808 365/130 |
| 8,279,667 B2* | 10/2012 | Kim | ........................ | G11C 8/14 365/171 |

(Continued)

FOREIGN PATENT DOCUMENTS

| | | |
|---|---|---|
| WO | WO 2008/139131 A1 | 11/2008 |
| WO | WO 2009/020258 A1 | 2/2009 |
| WO | WO 2009/072819 A1 | 6/2009 |

OTHER PUBLICATIONS

International Search Report and Written Opinion of the International Searching Authority dated Feb. 11, 2014 for corresponding International Patent Application No. PCT/SG2014/000002, filed Jan. 2, 2014.

*Primary Examiner* — David Lam
(74) *Attorney, Agent, or Firm* — Merchant & Gould P.C.

(57) ABSTRACT

A memory device comprising a ferromagnetic data nanowire, a ferromagnetic driver nanowire, read element and/or a spaced write element positioned about the data nanowire, wherein driving a domain wall in the driver nanowire remotely drives a domain wall in the data nanowire past the read element and/or the write element.

14 Claims, 10 Drawing Sheets

(56) References Cited

U.S. PATENT DOCUMENTS

| | | | |
|---|---|---|---|
| 8,958,241 B2 * | 2/2015 | Kondo | G11C 11/02 257/295 |
| 9,208,845 B2 * | 12/2015 | Currivan Incorvia | G11C 11/161 |
| 2008/0253161 A1 | 10/2008 | Parkin et al. | |
| 2009/0310241 A1 | 12/2009 | Lee | |

* cited by examiner

MEMORY DEVICE INCLUDING A DOMAIN WALL AND FERROMAGNETIC DRIVER NANOWIRE

This application is a National Stage Application of PCT/SG2014/000002, filed 2 Jan. 2014, which claims benefit of U.S. Provisional Ser. No. 61/748,316, filed 2 Jan. 2013 and which applications are incorporated herein by reference. To the extent appropriate, a claim of priority is made to each of the above disclosed applications.

FIELD

This invention relates to a memory device.

BACKGROUND

Racetrack memory or domain-wall (DW) memory is currently being researched as an alternative to solid-state memory devices. The potential advantage to this new technology is higher storage density higher than flash memory and much higher read/write performance than hard disks. However there are a number of problems that must be overcome in order to make the technology commercially feasible.

An example of a current impediment to DW memory is explained in: M. Kläui et al., *Phys. Rev. Lett.* 95, 026601 (2005). In summary direct application of current in the data element (to translate the domain walls) may cause heating, deform the DWs and/or cause information loss.

SUMMARY

In general terms the invention proposes remotely driving information in patterned ferromagnetic nanowires that are separated by domain walls (DWs). The information is stored as magnetic domains, and it is translated along the nanowire following the motions of the DWs (past the read and/or write elements). Remote-driving may be applicable in any high-density device using patterned nanowires.

In a first embodiment, patterned nanowires are made from materials with in-plane magnetization, such as NiFe (permalloy) or Co/Ni multilayers. The device may include two independent nanowires: a data element which carries all the magnetic domains that are separated by transverse domain walls (TDWs), and a driver element that has a single TDW. The DWs may be remotely driven which may have the advantage that direct heating of the data element is prevented and/or data loss is minimised.

In a second embodiment, a material with perpendicular magnetization is used. The nanowires may be made from $Co_{40}Fe_{40}B_{20}$ and they may be stacked vertically with a MgO spacer layer. The configuration of the DWs are changed due to the remote coupling. This change in the DW configuration may have the advantage that the speed of the memory is enhanced.

In a specific expression of the invention there is provided a device according to claim 1. Embodiments may be implemented according to any of claims 2 to 14.

BRIEF DESCRIPTION OF THE DRAWINGS

One or more embodiments will be described with the reference of the below drawings, in which:

FIG. 2(a) a schematic showing the winding numbers of transverse DWs. In the case where they have the same winding numbers, the two DWs are conserved upon collision. (b) a graph of the magnetization component in the x direction of an unperturbed DW ($DW_\lambda$) and a compressed DW ($DW_\delta$). Inset is the illustration of the unperturbed and compressed DWs FIG. 3 a graph of the calculated exchange force ($F_{exc}$) as a function of DW compression length ($\delta$). Shown in the upper right inset is the schematic diagram of the simulation model. Shown in the middle right inset is the exchange energy of unperturbed and compressed DWs as a function of wire width.

FIG. 8(a) Snapshot of the remote parallel driving of the two nanowire system. (b) The speed of the DWs as a function of simulation time. In [I], DW1 is being remote-driven and moves with the same speed as the driver DW. In [II], DW2 moves back to approach DW1 due to the magnetostatic interaction. The magnetostatic interaction also increases the forward speed of DW1. Shown in the inset is an illustration of the magnetostatic attraction between DWs of opposite magnetic charge. At [III], the two DWs collide and are being compressed. At [IV], the topological force drives DW2 to move ahead of DW1. A time span of approximately t≈6 ns is needed for the two DWs to reach equilibrium starting from the moment of impact.

FIG. 11(a) a schematic diagram of the dual magnetic domain wall memory architecture. Binary memory is stored in the data element by making use of a localized magnetic field. Driver element is used to drive the DWs in the data element by making use of the magnetostatic coupling. Subsequent DWs are driven by topological repulsion. Spintronic read sensor is integrated in the data element for data retrieving. (b) top-view snapshot of a simulation of a unit memory cell line. The memory unit consists of a data element and a driver element. Current is applied only to the driver element to drive the bit shift in the data element.

FIG. 14(a) Schematic diagram of the sandwich magnetic domain wall memory architecture. Binary memory is stored in the data element by making use of a localized magnetic field. Driver element is used to drive the DWs in the data element by making use of the magnetostatic coupling. GMR read sensor is integrated in the data element for data retrieving. (b) In a pair PMA nanowires that are stacked vertically, a DW that is being driven by pulse current will drag adjacent DWs with it. The zero-current DW motion in the adjacent nanowire is accommodated via a coupling between the DWs.

DETAILED DESCRIPTION

Magnetic domain walls (DWs) are the boundary region between the magnetic domains inside a ferromagnetic material. DWs can be driven into motion by applying external magnetic field and/or spin-polarized current to the system. According to the first embodiment, the DWs may utilise in plane magnetisation, or Traverse DWs (TDW).

Figure 1:
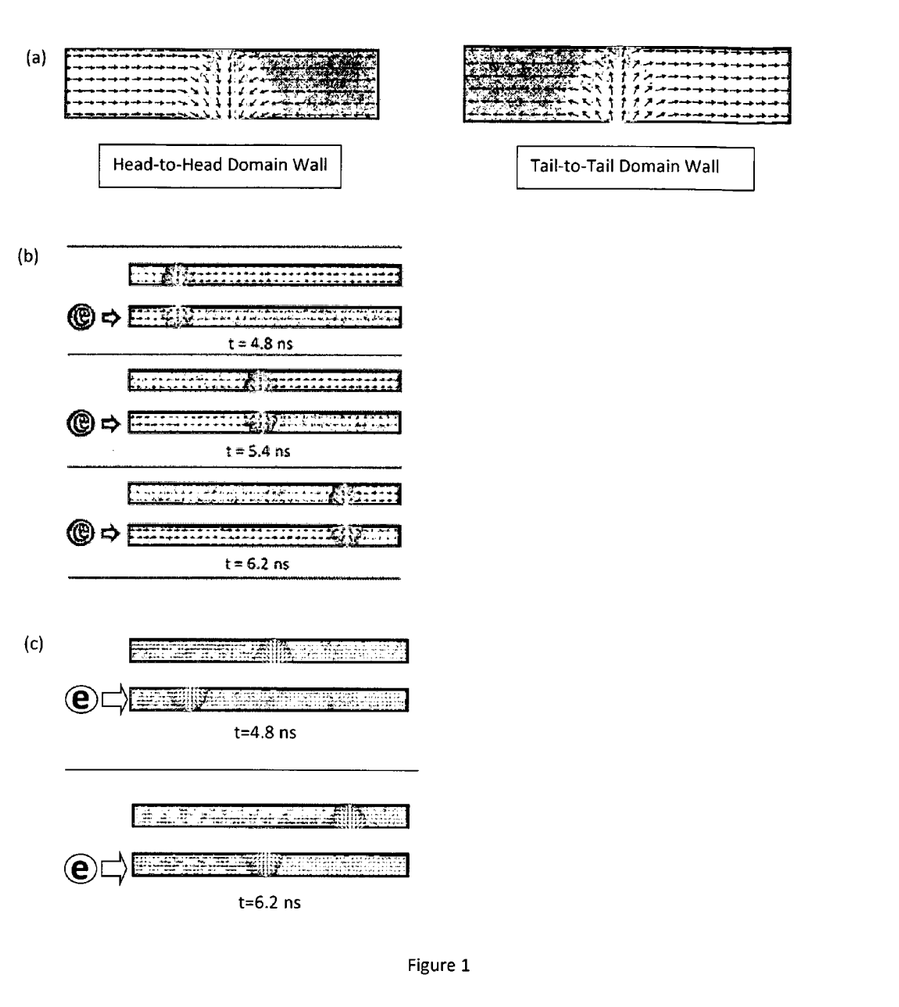
FIG. 1 a schematic showing a pair of closely-spaced nanowires, with a DW that is being driven by pulse current applied to one of the nanowire will drag adjacent DWs with it. The zero-current DW motion in the adjacent nanowire is accommodated via a coupling between the DWs.

The TDWs in the data and the driver elements can be classified as a Head-to-Head (HH) TDW, or as a Tail-to-Tail (TT) TDW. HH TDW separates two magnetic domains that are pointing towards each other, while TT TDW separates two magnetic domains that are pointing away from each other. FIG. 1(a) shows the snapshot of the simulated HH and TT DWs. The HH configuration is characterized by a positive magnetic charge, while the TT configuration is characterized by a negative magnetic charge. Therefore, magnetostatic interaction is expected between two TDWs. Due to the magnetostatic interaction, the motion of the driver TDW is coupled to the data TDW. Therefore when current is applied to the driver TDW, the data TDW will move in the same direction. This phenomenon becomes the mechanism for the remote driving, which allows us to drive the TDWs in the data element without direct application of current to the data element.

The two types of magnetic charge for the TDWs give us two possible scenarios of remote-driving: the first is the remote-driving based on attractive magnetostatic interaction, and the second is remote driving based on repulsive magnetostatic interaction. FIGS. 1(b) and (c) shows the snapshot of the simulations for the attractive and repulsive remote driving, respectively. The attractive remote driving is realized when the TDW in the driver element and the TDW in the data element have opposite magnetic charge; for instance, a HH TDW in the data element and a TT TDW in the driver element. The repulsive remote driving is realized when the TDWs have the same magnetic charge; for instance, both are HH TDWs or both are TT TDWs. In the case of the attractive remote driving, the two TDWs are moving side-by-side, while in the case of the repulsive remote driving, the TDW in the data element moves ahead of the TDW in the driver element.

To provide the strongest magnetostatic interaction between the TDWs within the data and the driver element, the magnetic charges are placed at the sides of the nanowires that are facing each other. The magnetic charges of TDWs are concentrated at the base of the triangular shapes that they adopted. In the case of HH TDW, the transverse component points to the base of the triangular shape, while for TT TDW the transverse component is pointing away from the base. Thus, the positions of the magnetic charges are controlled by the direction of the transverse components of the TDWs. FIGS. 1(b) and (c) shows the TDWs configurations with the strongest magnetostatic interaction: the bases of the TDW's triangular shape are facing each other. The maximum separation between the nanowires is roughly equal to the nanowire width. In other words, if the nanowire width is 100 nm, the separation between the nanowires is at most 100 nm. Smaller separation between the nanowires (more compact) is preferable to increase the coupling between the driver and the data element. FIGS. 1(b) and (c) also show the attractive and the repulsive remote driving, respectively.

In the case of the repulsive remote driving, it is possible for the remote-driven TDW to collide with another TDW in the data element. Depending on the direction of their transverse components, the two colliding TDWs can be annihilated or preserved. When the two TDWs are preserved, a topological repulsion is induced between them, which may be utilized in the device to drive multiple TDWs in the data element. To ensure that topological repulsion is present, all of the TDWs in the data element have the base of their triangular shapes facing the driver element.

By taking into account the contribution from the current, the magnetization dynamics can be described by the modified LLG equation in (1):

$$\frac{\partial \vec{m}}{\partial t} = -\gamma \vec{m} \times \vec{H}_{eff} + \alpha \vec{m} \times \frac{\partial \vec{m}}{\partial t} - b_j(\vec{j} \cdot \nabla)\vec{m} + \xi b_j \vec{m} \times (\vec{j} \cdot \nabla)\vec{m} \qquad (1)$$

with $\gamma$ as the gyromagnetic ratio, $\alpha$ as the damping constant, $\xi$ as the adiabacity, $b_j$ as the coupling constant between the current and the magnetization, $\vec{j}$ as the current density, and $\vec{m}$ as the unit vectors representing the direction of the local magnetization, respectively. The effective field ($H_{eff}$) is the representation of the contribution from the exchange energy, demagnetization energy, and the Zeeman energy. When an external magnetic field is applied, the effective field starts to align in the direction of the applied external field. In the current-driven DW motion, the underlying mechanism is the angular momentum transfer between the conduction electron and the local magnetization. This results in the DWs moving in the same direction as the flow of the conduction electron. We have determined that DW motion can also be induced from the exchange energy contribution in the magnetization dynamics. The exchange energy of a DW is given by (2)

$$E_{exc} = \frac{A}{M_s^2} \int |\nabla M^2| dV, \qquad (2)$$

with A as the exchange energy constant, M as the magnetization vector, V as the volume of the DW, and $M_s$ as the saturation magnetization value. When a DW is compressed, it increases the exchange energy of the system. The increased energy can be viewed as a result of the work done by the system to oppose the exchange repulsion force that the DW exerts to its surrounding. The exchange repulsion force is seen by a neighbouring DW as a local driving force that does not depend on external field or current. This phenomenon can only be observed when the DWs in the system are similar topologically.

Figure 2:
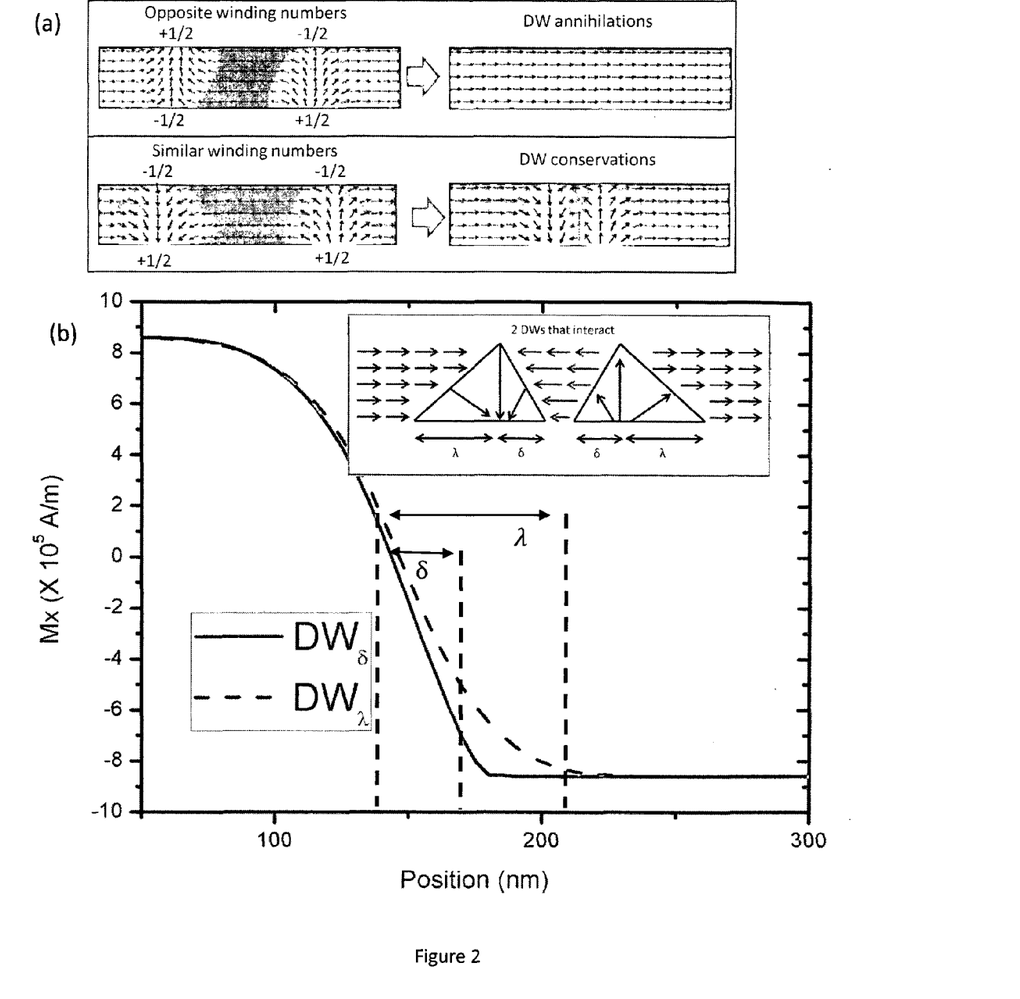

For soft magnetic material such as NiFe (permalloy) or Co/Ni multilayers, the stable DW states are determined mainly by the dimension of the nanostructures. In thin and narrow nanowires (eg: width<100 nm and thickness<15 nm), the stable magnetization configuration is the transverse DW. Mathematically, a transverse DW is described as a combination of two topological edge defects with opposite half-integer winding numbers (±½). In planar nanowires, a collision between two transverse DWs usually results in mutual DW annihilations. However, when the thickness of the nanowires is reduced below a threshold value (eg: for wire width of 100 nm, the threshold thickness is 6 nm), mutual annihilations in zero applied field condition can only be achieved when the two DWs have opposite winding numbers. When the two DWs have similar winding numbers, their topological defects interact and an exchange repulsion force is exerted between the two DWs. We consider a Head-to-Head (HH) DW and a Tail-to-Tail (TT) DW with opposite chirality in a single nanowire of thickness 6 nm. The opposite chirality gives the two DWs similar placement of winding numbers. With regard to the stray magnetic fields that they produce, a HH DW can be considered as a positive magnetic charge while a TT DW can be considered as negative magnetic charge. The magnetostatic interaction from the different charge attracts the two DWs to move closer to each other. In the opposite winding number case, this attraction is unopposed which leads to DW annihilations, as shown in FIG. 2(a). However, in the similar winding numbers case, their topological nature prevents them from annihilating. In this case, the DWs are compressed and the magnetostatic interaction is balanced by the exchange repulsion force that arises from their topological defects interaction.

Figure 3:
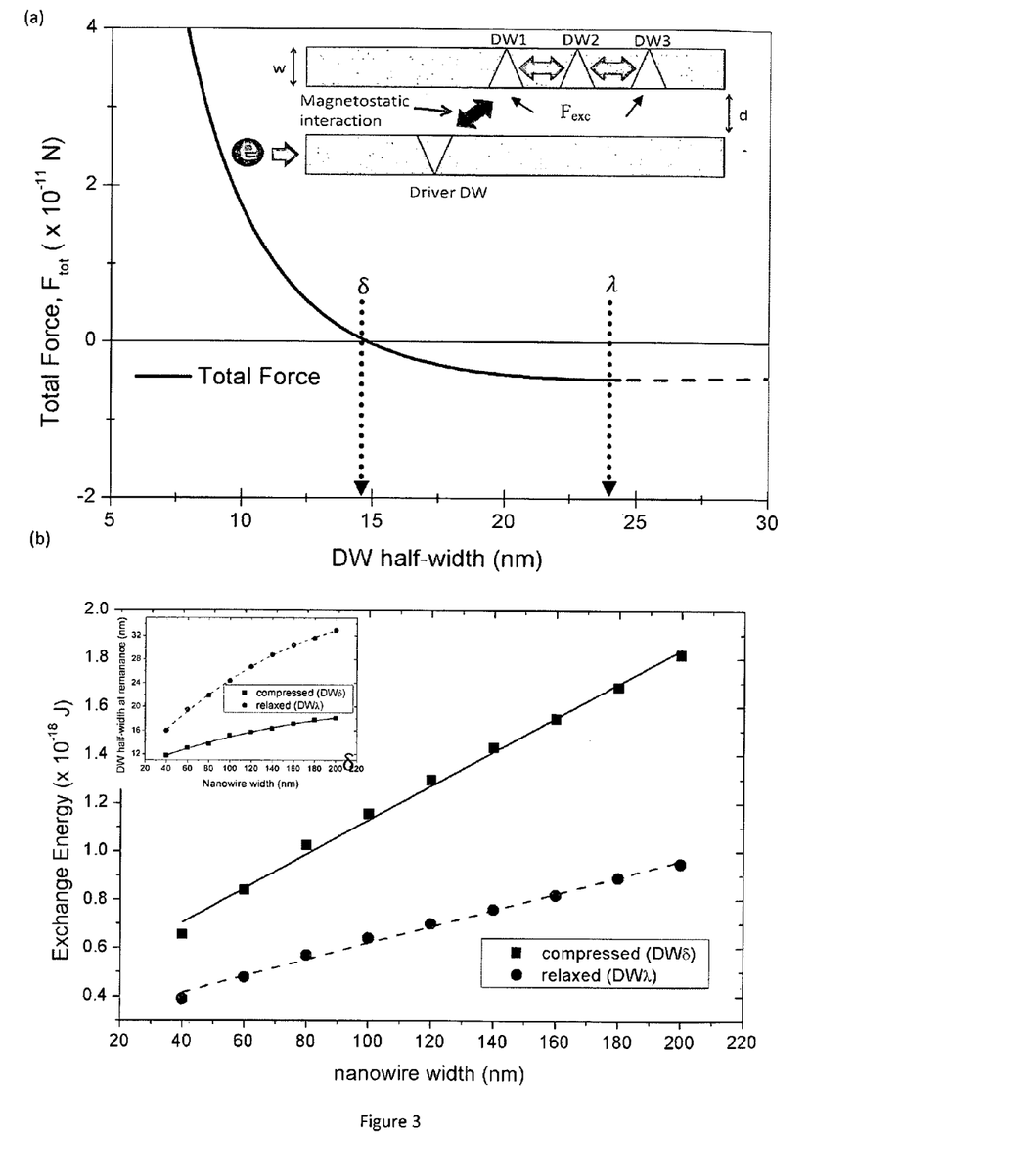

FIG. 2(b) shows a diagram of the magnetization configurations of two DWs with similar winding numbers. The DWs are compressed at the sides that are facing each other ($\delta < \lambda$). The compression is the physical representation of the repulsion force that they exert to each other. If we consider the magnetization component along the y axis ($M_y$) and the z axis ($M_z$) to be constant along their respective axis, the magnetization component along the x axis of a relaxed DW can be approximated as (3) and (4)

$$\vec{M} = M_s(\hat{x}\cos\theta + \hat{y}\sin\theta), \quad (3)$$

$$\cos\theta = -\tanh\left(\frac{x}{\lambda}\right), \quad (4)$$

for ($0 < x < 2\lambda$), with $2\lambda$ as the full width of a transverse DW. The cosine function is equal to a negative tan h function for HH DW and positive function for TT DW. The exchange energy ($E_{exc}$) of a single DW is therefore equal to (5):

$$E_{exc} = Awt \int_{-\lambda}^{+\lambda} |\nabla M|^2 \, dV \approx 2\frac{Awt}{\lambda}, \quad (5)$$

with w and t as the width and the thickness of the nanowire, respectively. $A=13\times10^{-12}$ J/m is the exchange interaction constant of the permalloy. The expression shows that the exchange energy increases rapidly as the half-width of the transverse DW ($\lambda$) is reduced. The energy calculation above is applicable when the DW has width of $2\lambda$; when the domain wall is compressed, the energy of each side of the DW is calculated separately (6).

$$E_{exc} = E_{exc\_left} + E_{exc\_right} = \frac{Awt}{\delta_{left}} + \frac{Awt}{\delta_{right}}. \quad (6)$$

Where $E_{exc\_left}$ and $E_{exc\_right}$ are the exchange energy of the left and the right side of the DW, respectively. $\delta_{left}$ and $\delta_{right}$ are the half-width of each side of the DW. Shown in FIG. 3(a) is the exchange energy of a relaxed transverse DW ($DW_\lambda$) and a DW that is compressed at the left side ($DW_\delta$) as functions of nanowire width. The energy values were obtained by using the OOMMF software. The calculated half width, both the uncompressed ($\lambda_{rem}$) and the compressed ($\delta_{rem}$) in remanance are shown in the inset of FIG. 3(a).

The increased exchange energy of the compressed DWs as compared to the relaxed DW can be considered as a result of the work done by the system to oppose the repulsion force, $F_{exc}$ that the two DWs exert to each other during the compression. In equilibrium, with zero external field and current, the repulsion force prevents the two DWs to annihilate under their own magnetostatic interaction. To obtain the repulsion force, we find the derivative of the exchange energy with respect to the DW compression, $\delta$ in (7):

$$F_{exc} = -\frac{\partial E_{exc\_left}}{\partial \lambda}\bigg|_{\lambda=\delta} = \frac{Awt}{\delta^2}. \quad (7)$$

For nanowire with width w=100 nm and thickness t=6 nm, and DW compression of $\delta_c$=35.62 nm, the equation gives $F_{exc}$=1.23×10$^{-11}$ kg·m/s$^2$. The length of the nanowire depends the desired data density, typically it is around 10-15 µm to accommodate ~100 magnetic bits. The magnitude of the exchange repulsion force is comparable to a driving force that is exerted by a spin-polarized current to a DW in current-driven DW motion.

To explore the role of the repulsion force in DW dynamics, we consider the case of one-directional collision between two DWs. In the one-directional collision, a single DW is remote-driven and is allowed to collide with another DW. The local driving force that acts on the first DW should not affect the dynamic of the second DW. In this scenario, the only force that acts on the second DW is the exchange repulsion force and therefore its dynamics should be attributed to the exchange repulsion force.

Figure 4:
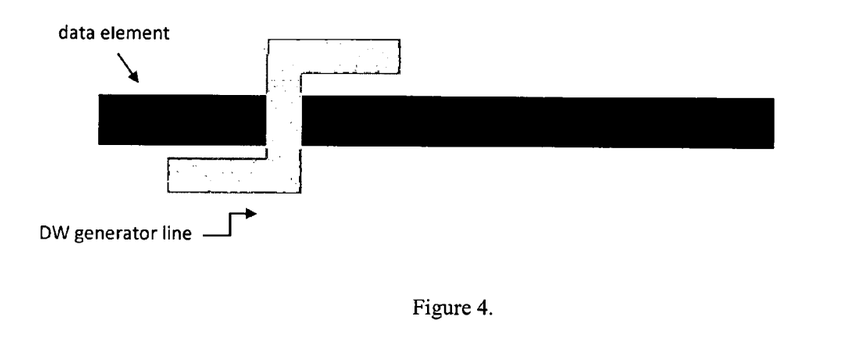
FIG. 4 a schematic of the DW-generator DW generator line (top view).

In the remote driving technique, another nanowire is placed next to our nanowire of interest. The spacing between the two nanowires is expected to be as close as possible, typically less than 100 nm. The first nanowire, or the nanowire of interest, is called as the data element, while the second nanowire is called as the driver element. A single DW, which shall be called as the driver DW, is generated in the driver element to be used as a stray magnetic field generator. FIGS. 1(b) and (c) shows the orientations of the driver DW for the strongest magnetostatic interaction: the bases of the DW's triangular shape are facing each other. The driver DW and DW1 are coupled, and their dynamics are related to each other. A diagram of the simulation of this is shown in the upper-right inset of FIG. 3(b). The driver DW and DW1 are oriented such that the triangular bases face each other to assure the strongest magnetostatic attraction between them. The triangular shape is unique to transverse domain walls. To ensure that the topological repulsion is present, the next DWs in the data element need to have similar winding numbers placement, this is achieved by aligning all of the DWs in the data element such that the bases of their triangular shapes face the driver element To inject the DWs into the nanowires, one possible solution is to fabricate an S-shaped DW generator line to be used to create a fringing field. This DW generator line can be implemented in our device with a slight modification. FIG. 4 shows a S-shaped DW generator line to create a transverse fringing field.

Figure 5:
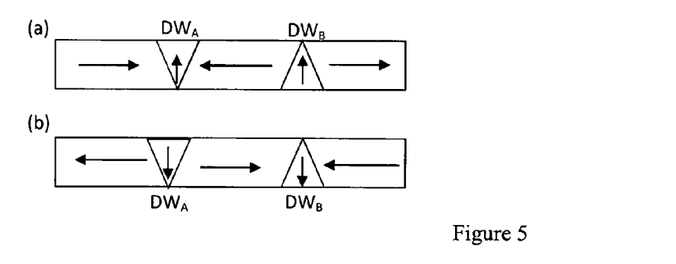
FIG. 5 the magnetization state of the nanowire after the application of (a) positive current and (b) negative current through the DW generator line.

With the following design, the DW generator line will generate an Oersted field ($H_g$) at an angle ($\alpha$) with respect to the nanowire. The x component of the field ($H_{gx}$) serves to switch the magnetization of the data element and create 2 DWs at the same time, while the y component ($H_{gy}$), will determine the chirality of the DWs. In FIG. 5 when a positive current is applied to the DW generator line, two DWs with Up chirality will be created. Similarly, when negative current is applied, two DWs with Down chirality will be created.

Figure 6:
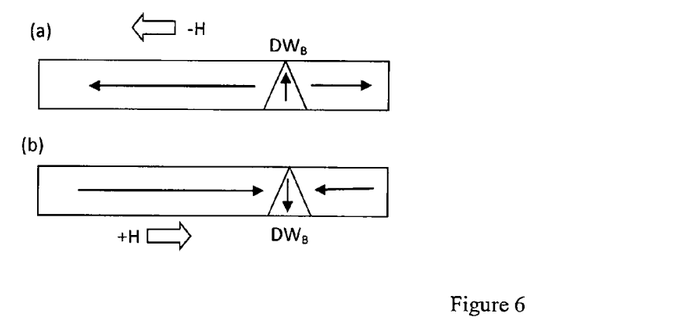
FIG. 6 The magnetization state of the nanowire after the application of (a) negative field and (b) positive field through the DW generator line.
Figure 7:
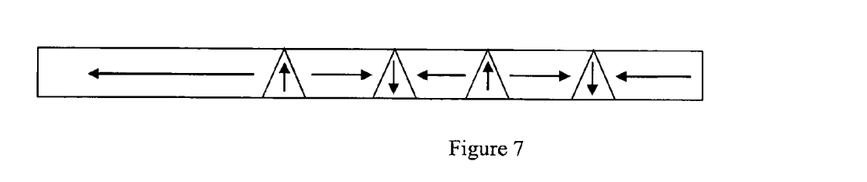
FIG. 7 the magnetization state of the data element after multiple DW generations and injections processes.

After the DWs are created, we apply a field in the x direction to send $DW_B$ into +x direction and $DW_A$ to the −x direction. Eventually $DW_A$ will be annihilated at the left end and we are left with a single DW with its base at the lower edge of the nanowire as shown in FIG. 6. This can be repeated multiple times to create a series of DWs in the data element as shown in FIG. 7.

Figure 8:
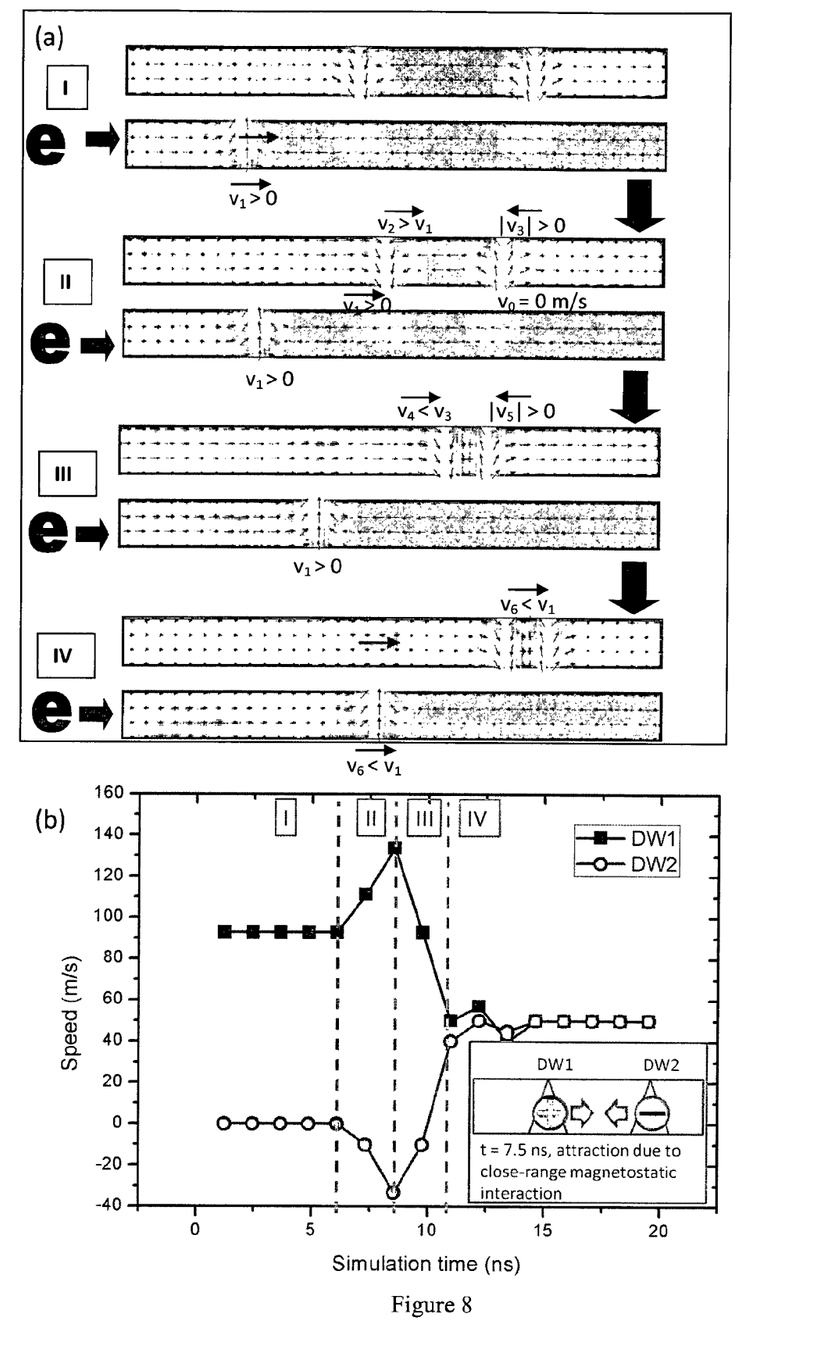

Spin polarized current is then applied to the driver element. As the driver DW moves, it interacts with the first DW (DW1) in the data_element due to their stray magnetic field interaction. Eventually DW1 collides with the next DW (DW2) in the data element. The collision is one-directional as the stray magnetic field from the driver DW does not affect DW2. During the collision, the exchange repulsion comes into effect which results in the motion of DW2 in the same direction as DW1. While the remote driving technique serves as the driving force for DW1 in the data element, it is the exchange repulsion that continuously drives DW2 ahead. Shown in FIG. 8(a) are the snapshots of the simulation to show the motion of the DWs. The current density applied to the driver DW is J=1.06×10¹² A/m². Initially (I), the driver DW and DW1 move together with an equal speed of $v_1$≈90 m/s, at this stage, DW2 remains motionless; the stray magnetic field from the driver DW only affects DW1. For a short period of time (II) between t≈6 ns and t≈8 ns, the magnetostatic attraction between DW1 and DW2 propels DW1 to move forward, increasing its speed to $v_2$≈130 m/s. The attraction also pulls DW2 to move backward with a speed of $v_3$≈−40 m/s. At t≈8 ns, the collision occurs and the topological repulsion starts to become prominent, resulting in the linear momentum transfer between the DWs. The two DWs start to get compressed (III). As a result, DW2 is pushed by DW1 to move in the same direction (IV) with a speed of $v_6$≈50 m/s. Shown in FIG. 8(b) is the speed of DW1 and DW2 as a function of time. From t≈8 ns to t≈14 ns, momentum is transferred between the two DWs until they arrive at an equal speed.

Figure 9:
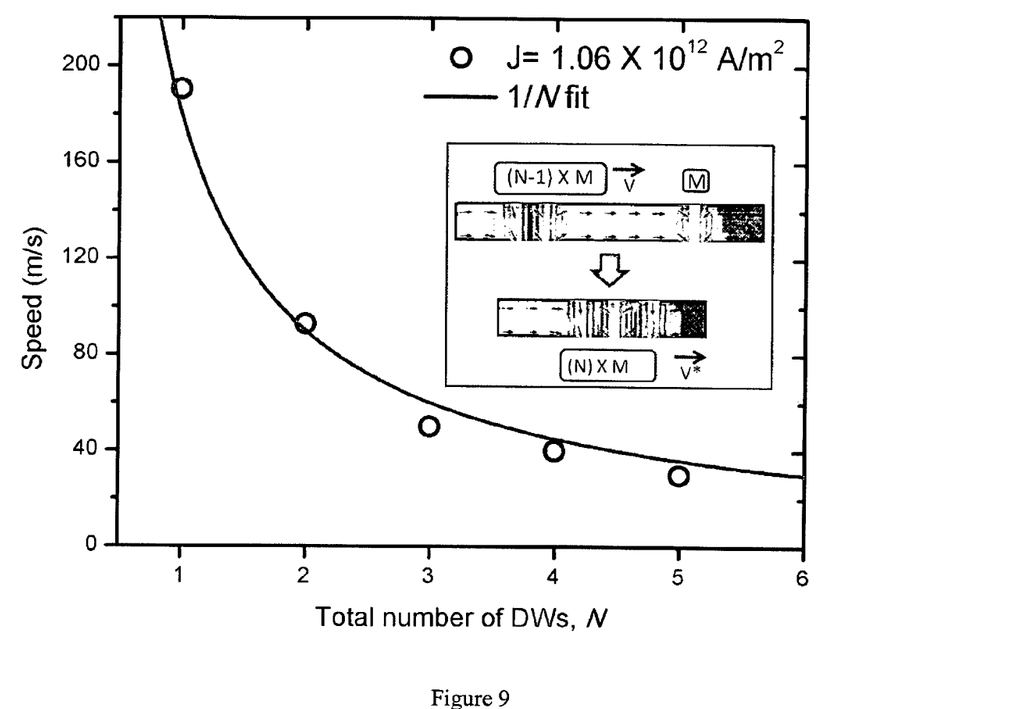
FIG. 9 a graph of the speed of the DW group as a function of the total numbers of DWs in the system (N). The speed of the group is shown to decrease following 1/N FIG. 10 a snapshot of the DWs when a very high current density is applied to the driver element. Due to the high speed motion of the driver DW, it is able to move pass the DW group in the data element.

It is possible to drive multiple DWs in the data element by utilizing multiple collision processes. Shown in FIG. 9 is the speed of the collective DWs as a function of the total number of DWs (N) in the system. The current density applied to the driver DW is J=1.06×10¹² A/m². The first point (N=1) refers to the case where we are only driving the driver DW. If we consider each DW to have a certain mass (M), then the collision phenomenon can be modelled as an inelastic collision in which the mass of the DW group in the system increasing proportionally to N. Conservation of momentum gives us the following relationship in (8):

$$V_N \propto \frac{1}{N}. \quad (8)$$

The speed of a DW ($V_N$) is shown to be inversely proportional to the total number DWs in the group.

Figure 10A:
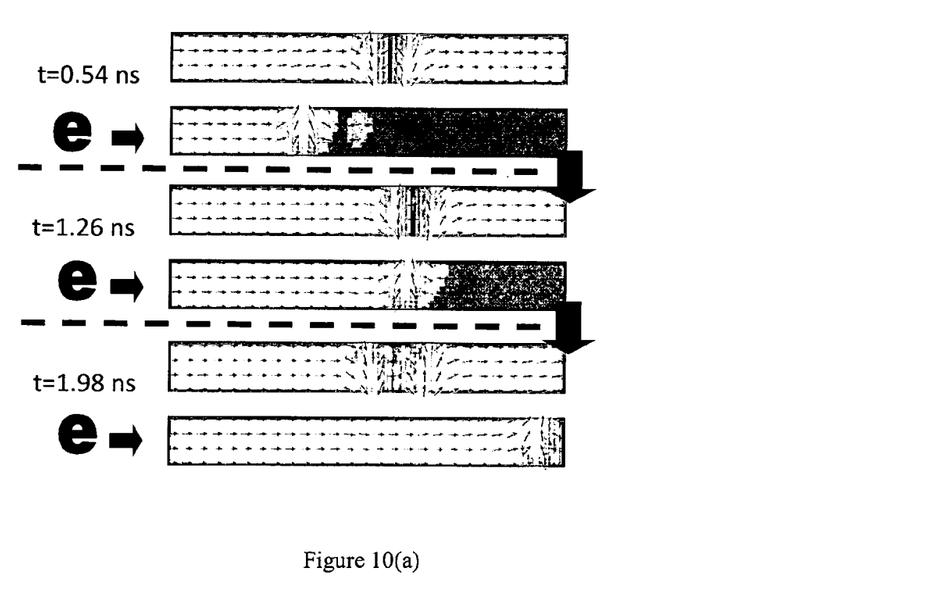

The motions of DW2 and the subsequent DWs are the results of momentum transfer from the remote-driven DW. However, as can be seen from FIG. 8(b), the momentum transfer is not instantaneous; approximately t≈6 ns is needed for the DWs that are involved in the collision to reach an equilibrium speed. Therefore, it is possible for a driver DW that is moving with a very high speed to 'bypass' a group of DWs in the data element when there is not enough time for the DW group to complete the momentum transfer process. FIG. 10(a) shows snapshots of the simulation with current density of 4.24×10¹² A/m² applied to the driver element. DW1 and DW2 are initially placed very close to each other and far away from the driver DW. Due to the high propagation speed of the driver DW, the interaction time between the driver DW and DW1 is very short. Consequently, there is not enough time to transfer momentum to DW1 and DW2. As a result, the driver DW is able to move pass DW1 and DW2 and continues its motion without any coupling to the DWs in the data element.

Figure 10B:
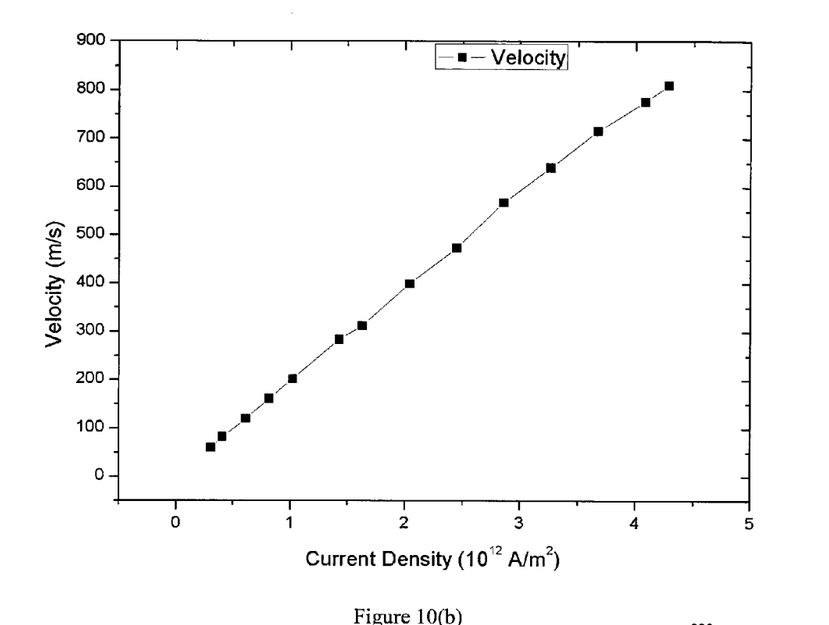

The DW speed primarily depends primarily on the applied current density. Shown in FIG. 10(b) is the DW speed vs applied current density of the driver DW. For the driver to be able to bypass two DWs in the data element, the DW has to have a speed higher than 750 m/s.

Figure 11:
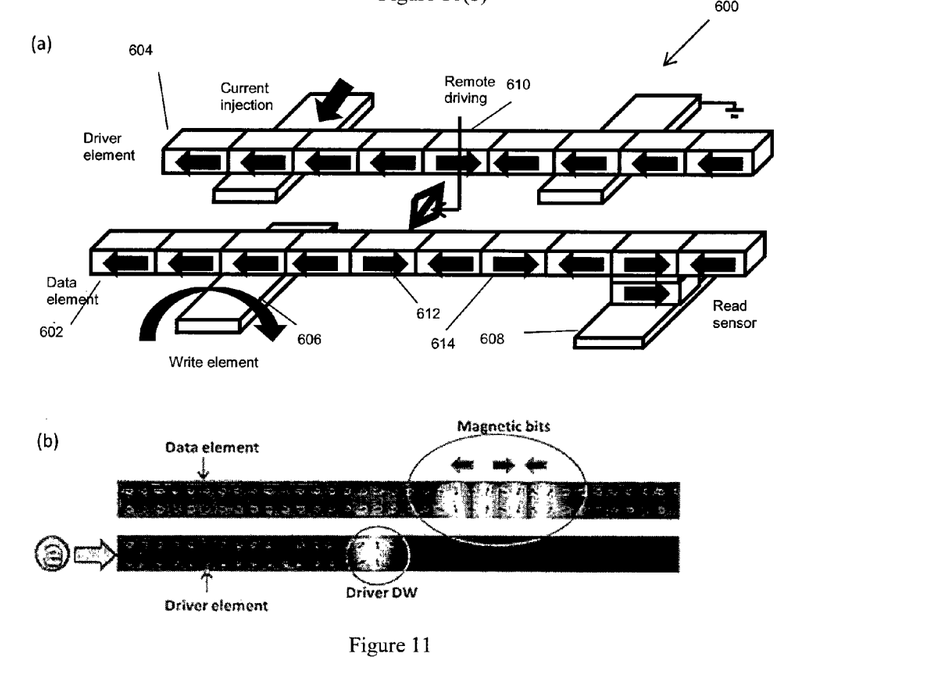

FIG. 11(a) shows a schematic diagram of the dual magnetic domain wall memory architecture 600. Binary memory is stored in the data element 602 by making use of a localized magnetic field domains 604. The state for each bit 604 is written using a write element 606. A spintronic read sensor 608 (GMR sensor for in-plane magnetization) is integrated in the data element 602 for data retrieving from each bit 604. A driver element 610 is used to drive the DWs 612 in the data element by making use of the magnetostatic coupling. Subsequent DWs 614 are driven by topological repulsion as described previously.

Figure 12:
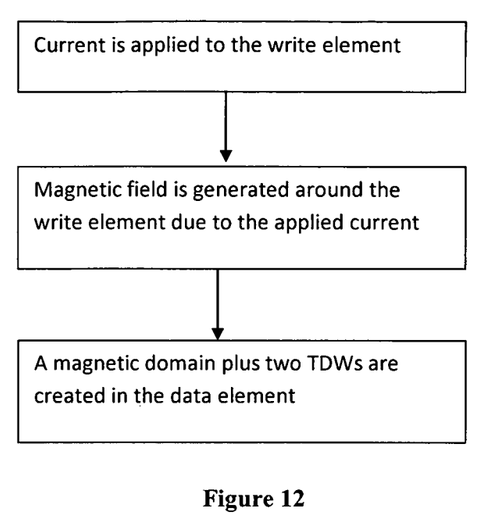
FIG. 12 a flow diagram of the process of writing to the data element.

A method of writing to the data element is shown in FIG. 12. Current is applied to the write element 606. A magnetic field generates around the write element 606, which creates a magnetic domain plus two TDWs in the data element.

Figure 13:
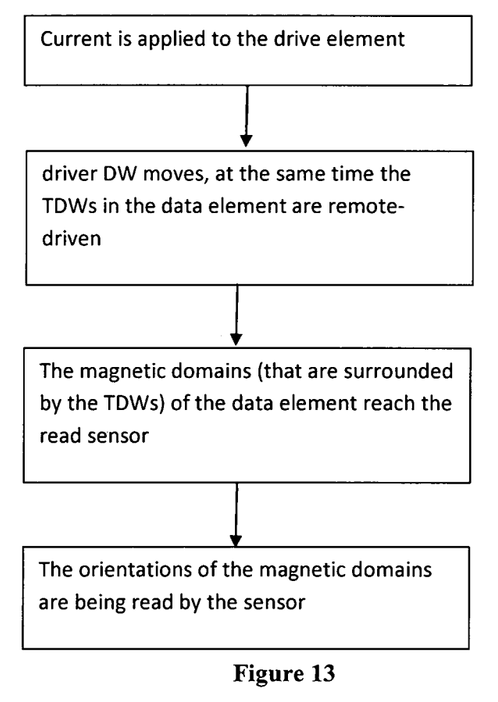
FIG. 13 a flow diagram of the process of reading from the data element.

A method of reading from the data element is shown in FIG. 13. The driver element 610 is energised, which drives the DWs in the driver element which in turn remotely drives TDWs in the data element. Each magnetic domain passes by the read sensor 608 and is read.

The device 600 may be fabricated using high precision electron beam litography (EBL), to pattern the small dimensions of the nanowire. All parts of the device are patterned in a sequence. The nanowires may be made from $Ni_{80}Fe_{20}$ or $Ni_{81}Fe_{19}$ or Co/Ni magnetized in-plane. The spacing between the nanowires is determined by the fabrication process.

According to a second embodiment information in a patterned ferromagnetic nanowire may be transferred by exploiting the magnetostatic interaction and the magnetization configuration of domain walls (DWs) in materials with perpendicular magnetic anisotropy (PMA). DWs in magnetic nanowires can be broadly classified as Bloch or Neel wall. In the Bloch configuration, the magnetization of the DW rotates out-of-plane, while for Neel wall, the magnetization rotates in-plane. Bloch walls are found in PMA materials, such as Co/Ni and CoFeB. Multiple DWs in multiple PMA nanowires can be driven by applying current to a single nanowire. The magnetization configuration of the DWs are also changed from the Bloch to the Neel configuration, which results in a faster DW motions upon the application of current.

In the second embodiment each of the DW in the data element is paired to a DW in the driver element; in other words, there is a one-to-one coupling between the DWs in the data and the driver elements. The writing and reading is similar to the first embodiment. To write a data block, current is applied to the write element. One magnetic domains and two DWs will be created at the same time on both the driver and data element (giving a total of two magnetic domains and four DWs). The DWs will be coupled immediately, and when current is applied to the driver elements, all four DWs will move at the same time to the same direction.

Figure 14:
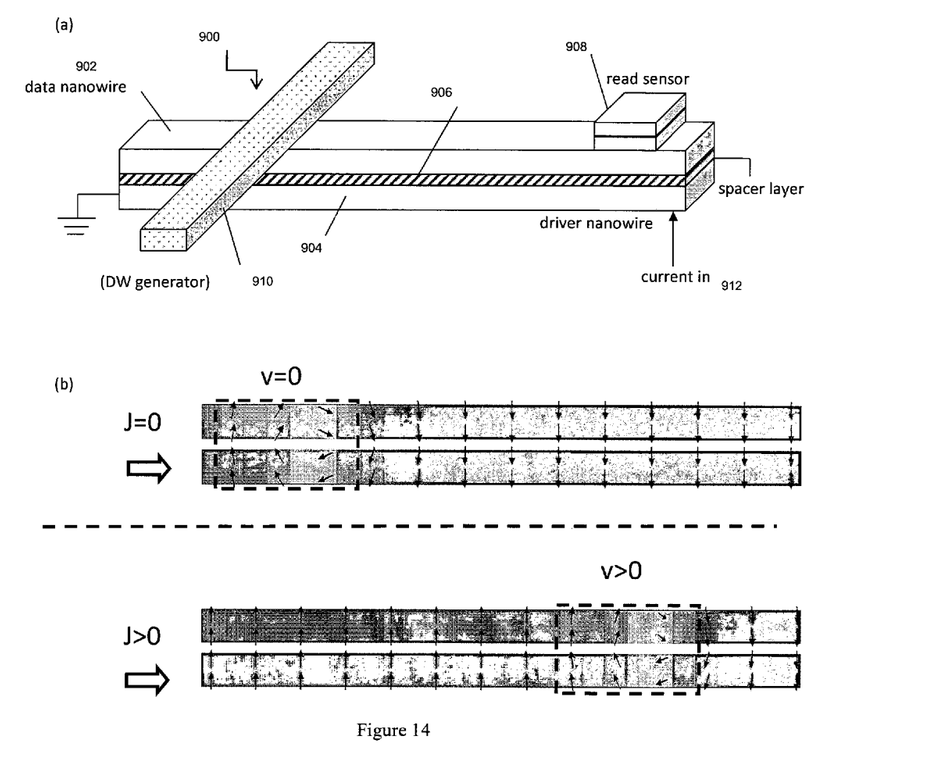

FIG. 14 shows a device 900 includes a data element 902 at the top, a driver element 904 at the bottom and a spacer layer 906 separating them. The PMA nanowires 902,904 consist of Co/Ni or CoFeB, while the spacer layer 906 is made of MgO. For example the nanowires may be $Co_{40}Fe_{40}B_{20}$ with magnetization out-of-plane.

Figure 15:
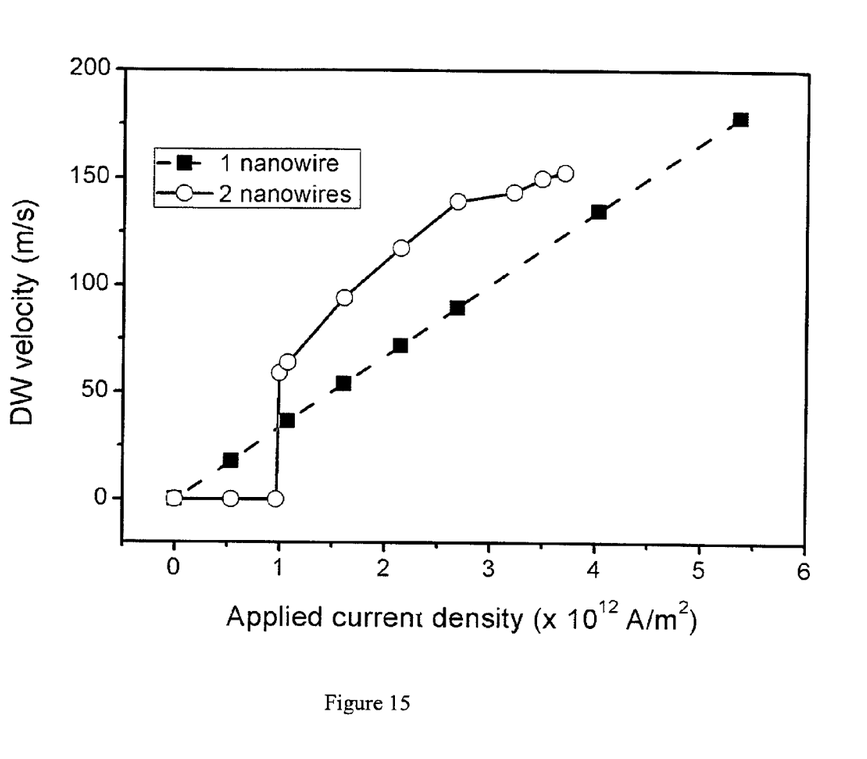
FIG. 15 Speed of the coupled DW in the PMA sandwich structure as a function of the applied current density (red line). The speed of a DW in a single layer PMA (black) is also included for comparison.

The DWs at each nanowire are generated at the same position. Typically, when we only consider the data nanowire, the DWs automatically assume the Bloch configuration, where the magnetization rotates out-of-plane. However, due to the presence of the driver nanowire, the DWs in the data nanowire are then changed into the Neel configuration. The DWs in the driver and the data nanowires are coupled to each other. Therefore, by applying current to the driver nanowire, the DWs in the data nanowire are able to be remote-driven together due to the coupling. Furthermore, the DWs are able to move faster due to the unique Neel configuration that they adapt. Shown in FIG. 15 is the calculated speed of the coupled DW in the PMA sandwich structure from the simulations. The simulation results indicate that the DWs in the PMA sandwich structure may move approximately 50% faster than in a conventional PMA nanowire.

The DWs in the driver and data nanowires are generated simultaneously by passing current through a write element 910 that lies on top of the data nanowire. Magnetic fields are then created around the write element 910 which is then used to reverse the magnetization and create DWs on the data and driver nanowires. Current is then applied 912 to the driver nanowire to drive the DWs within the driver nanowire. The DWs in the data nanowire are driven at the same time due to the coupling between two nanowires. The data are then read by a GMR sensor 908 (for perpendicular magnetization) that is included in the device.

Whilst exemplary embodiments of the invention have been described in detail, many variations are possible within the scope of the invention as claimed as will be clear to a skilled reader.

The invention claimed is:

1. A memory device comprising
a ferromagnetic data nanowire,
a ferromagnetic driver nanowire disposed parallel to the data nanowire,
a read element and/or a write element positioned adjacent the data nanowire,
wherein driving a domain wall in the driver nanowire remotely drives a domain wall in the data nanowire past the read element and/or the write element.

2. The memory device of claim 1 wherein a first spin polarized current in the driver nanowire remotely drives a first transverse domain wall along the data nanowire.

3. The memory device of claim 2 wherein the data nanowire and/or the driver nanowire have in-plane magnetization.

4. The memory device of claim 2 wherein multiple transverse domain walls are transferred along the data nanowire.

5. The memory device of claim 2 wherein a second larger spin polarized current bypasses a second transverse domain wall in the data nanowire.

6. The memory device of claim 1 wherein the data nanowire and the driver nanowire are spaced apart within a predetermined threshold.

7. The memory device of claim 4 wherein all of the transverse domain walls in the data nanowire are aligned.

8. The memory device of claim 1 wherein the data nanowire and/or the driver nanowire are fabricated from $Ni_{80}Fe_{20}$ or $Ni_{81}Fe_{19}$ or Co/Ni.

9. The memory device of claim 1 wherein a width of the data nanowire and/or the driver nanowire is approximately 100 nm and a thickness of the data nanowire and/or the driver nanowire is less than approximately 6 nm.

10. The memory device of claim 1 wherein the data nanowire and/or the driver nanowire have perpendicular magnetization.

11. The memory device of claim 10 wherein the data nanowire and/or the driver nanowire are fabricated from Co/Ni or CoFeB.

12. The memory device of claim 11 wherein the data nanowire and/or the driver nanowire are fabricated from $Co_{40}Fe_{40}B_{20}$.

13. The memory device of claim 12 wherein drive current applied to the driver nanowire switches a transverse domain wall from a Bloch wall to a Neel wall.

14. The memory device of claim 13 further comprising a spacer layer made of MgO between the data nanowire and the driver nanowire.

* * * * *